United States Patent
Liu et al.

(10) Patent No.: US 11,050,345 B2
(45) Date of Patent: Jun. 29, 2021

(54) POWER SUPPLY APPARATUS AND ELECTRONIC CONTROL UNIT

(71) Applicant: Hitachi Automotive Systems, Ltd., Hitachinaka (JP)

(72) Inventors: Ming Liu, Tokyo (JP); Taizo Yamawaki, Tokyo (JP); Atsushi Arata, Ibaraki (JP); Yasushi Sugiyama, Ibaraki (JP); Ryusuke Sahara, Ibaraki (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 29 days.

(21) Appl. No.: 16/619,001

(22) PCT Filed: Apr. 24, 2018

(86) PCT No.: PCT/JP2018/016526
§ 371 (c)(1),
(2) Date: Dec. 3, 2019

(87) PCT Pub. No.: WO2019/008873
PCT Pub. Date: Jan. 10, 2019

(65) Prior Publication Data
US 2021/0126527 A1    Apr. 29, 2021

(30) Foreign Application Priority Data

Jul. 7, 2017 (JP) .............................. JP2017-133263

(51) Int. Cl.
*H02M 3/04* (2006.01)
*H03K 3/017* (2006.01)

(52) U.S. Cl.
CPC .............. *H02M 3/04* (2013.01); *H03K 3/017* (2013.01)

(58) Field of Classification Search
None
See application file for complete search history.

(56) References Cited

U.S. PATENT DOCUMENTS 7,173,404 B2 *   2/2007  Wu ..................... H02M 3/156
                                          323/283
7,504,812 B2 *   3/2009  Riehl ................. H02M 3/156
                                          323/283
(Continued)

FOREIGN PATENT DOCUMENTS

JP      2001-258245 A    9/2001
JP      2010-68671 A     3/2010
(Continued)

OTHER PUBLICATIONS

International Search Report (PCT/ISA/210) issued in PCT Application No. PCT/JP2018/016526 dated Jun. 12, 2018 with English translation (two (2) pages).
(Continued)

*Primary Examiner* — Jeffery S Zweizig
(74) *Attorney, Agent, or Firm* — Crowell & Moring LLP

(57) ABSTRACT

A power supply apparatus that can realize ripple reduction, and an electronic control unit including the power supply apparatus are provided. In view of this, a PWM controller generates a PWM signal, and a PFM controller generates a PFM signal having a phase independent of the PWM signal. A level-fixed period generating circuit sets a level-fixed period having a start timing at a selection timing set to an edge of the PFM signal. A mode selecting circuit selects, at the selection timing and as a switching control signal, the PWM signal instead of the PFM signal, and controls a logic level of the switching control signal in the level-fixed period starting at the selection timing, such that the logic level becomes a fixed logic level.

15 Claims, 12 Drawing Sheets

(56) References Cited

U.S. PATENT DOCUMENTS

| | | | | |
|---|---|---|---|---|
| 7,843,186 B2 * | 11/2010 | Nishida | ............... | H02M 3/158 |
| | | | | 323/284 |
| 8,106,642 B2 * | 1/2012 | Chen | ............... | H02M 3/1588 |
| | | | | 323/284 |
| 8,957,661 B2 * | 2/2015 | Heo | ............... | H02M 3/156 |
| | | | | 323/290 |
| 9,024,932 B2 * | 5/2015 | Chen | ............... | H02M 3/156 |
| | | | | 345/211 |
| 2010/0066328 A1 | 3/2010 | Shimizu et al. | | |
| 2016/0056719 A1 | 2/2016 | Teh | | |

FOREIGN PATENT DOCUMENTS

| | | |
|---|---|---|
| JP | 2011-24345 A | 2/2011 |
| JP | 2016-46893 A | 4/2016 |

OTHER PUBLICATIONS

Japanese-language Written Opinion (PCT/ISA/237) issued in PCT Application No. PCT/JP2018/016526 dated Jun. 12, 2018 (three (3) pages).

* cited by examiner

POWER SUPPLY APPARATUS AND ELECTRONIC CONTROL UNIT

TECHNICAL FIELD

The present invention relates to a power supply apparatus, and an electronic control unit, and for example relates to a power supply apparatus mounted on a vehicle-mounted ECU (Electronic Control Unit).

BACKGROUND ART

Patent Document 1 illustrates a power supply circuit that can respond to variations of a load promptly. The power supply circuit switches the frequency of a PWM signal when a variation of a load is detected, and switches the frequency back to its original value after a lapse of a predetermined length of time. At this time, the power supply circuit performs substantial switching of the frequency after separately inserting a predetermined signal according to the switching of the frequency.

PRIOR ART DOCUMENT

Patent Document

Patent Document 1: JP-2016-46893-A

SUMMARY OF THE INVENTION

Problems to be Solved by the Invention

In recent years, in the field of car electronics, numerous electronic control units (called ECUs) are put into practical use for power train control, body control, safe driving control, and the like. The ECUs are normally equipped with a microcontroller (abbreviated to mi-con) responsible for various types of control, and a power supply apparatus that generates power supply to be supplied to the mi-con. The power supply apparatus is, for example, a DC/DC converter adopting a switching regulator system that converts a DC voltage input based on a battery power supply into a different DC voltage, and outputs the resultant DC voltage.

Current consumption of mi-cons for ECUs has been increasing along with an increase in control targets, and the rate of change of current consumption per unit time also has been increasing along with switching or the like between activation and deactivation of each control target (e.g., turning on and off of a sleep mode). Power supply apparatuses need to maintain variations of a power supply voltage of a mi-con (i.e., ripples of an output voltage) within a required range even if the rate of change of current consumption of the mi-cons (the sudden change rate of load current as seen from the power supply apparatuses) increases in this manner. Because of this, power supply apparatuses are required to have enhanced response speed to sudden changes of load current (called sudden load changes).

Possible systems to enhance response speed include a system in which switching is performed between PWM (Pulse Width Modulation) control and PFM (Pulse Frequency Modulation) control in response to sudden load changes. However, there is a fear in this case that excessive ON-periods or OFF-periods occur in a switching element, incurring an increase in ripples, at the time of switching of control. This is because if switching is performed between two signals (the PWM signal, and PFM signal) having phases that are controlled independently, the pulse width at the time of switching of control cannot be controlled sufficiently unlike the case where the frequency of one PWM signal is switched as in Patent Document 1.

The present invention has been made in view of such circumstances, and one of objects thereof is to provide a power supply apparatus that can realize reduction in ripples, and an electronic control unit including the power supply apparatus.

The object of the present invention explained above, and other objects and novel features of the present invention will be apparent from the description and attached drawings of the present specification.

Means for Solving the Problems

The summary of representative ones of embodiments disclosed in the present application is, if explained simply, like the one that follows.

A power supply apparatus according to one embodiment has first and second controllers, a phase adjustment period setting circuit, a mode selecting circuit, and a switching element. The first controller uses a first control mode to generate a first switching signal, and the second controller uses a second control mode to generate a second switching signal having a phase independent of the first switching signal. The phase adjustment period setting circuit sets a phase adjustment period having a start timing at a selection timing set to an edge of the second switching signal. The mode selecting circuit selects, at the selection timing and as a switching control signal, the first switching signal instead of the second switching signal, and controls a logic level of the switching control signal in the phase adjustment period starting at the selection timing, such that the logic level becomes a fixed logic level. The switching element is controlled such that the switching element is turned on and turned off based on the switching control signal from the mode selecting circuit, and controls the output voltage.

Advantages of the Invention

Effects that can be obtained by representative embodiments of the invention disclosed in the present application are, if explained simply, that it becomes possible to realize reduction in ripples.

MODES FOR CARRYING OUT THE INVENTION

In the following embodiments, when it is required to do so for convenience, explanations are provided about a plurality of sections or embodiments separately, but they are not unrelated to each other unless noted otherwise expressly, and one of them has a relationship with some or all of the others of them such as a variant, a detail, or a supplementary explanation. In addition, in the following embodiments, if numbers and the like related to elements (including the numbers of them, the numerical values of them, the amounts of them, the ranges of them, and the like) are mentioned, they are not limited to those particular numbers, and the numbers may be equal to or larger than or equal to smaller than the particular numbers unless noted otherwise expressly, unless the numbers are apparently limited to the particular numbers according to rules, or in other cases.

Furthermore, in the following embodiments, needless to say, their constituent elements (also including element steps, and the like) are not necessarily essential unless noted otherwise expressly, unless they are deemed to be apparently essential according to rules, or in other cases. Similarly, in the following embodiments, when shapes, positional relationships and the like of constituent elements and the like are mentioned, they include those that are substantially approximately the same as or similar to those shapes and the like, and the like unless noted otherwise expressly, unless they are deemed to be apparently not so according to rules, or in other cases. This applies also to the explanations about the numerical values and ranges.

Hereinafter, embodiments of the present invention are explained in detail based on the drawings. Note that, in all the drawings for explaining the embodiments, identical members are given identical signs as a general rule, and repetitive explanations thereof are omitted.

FIRST EMBODIMENT

Gist of Electronic Control Unit

Figure 1:
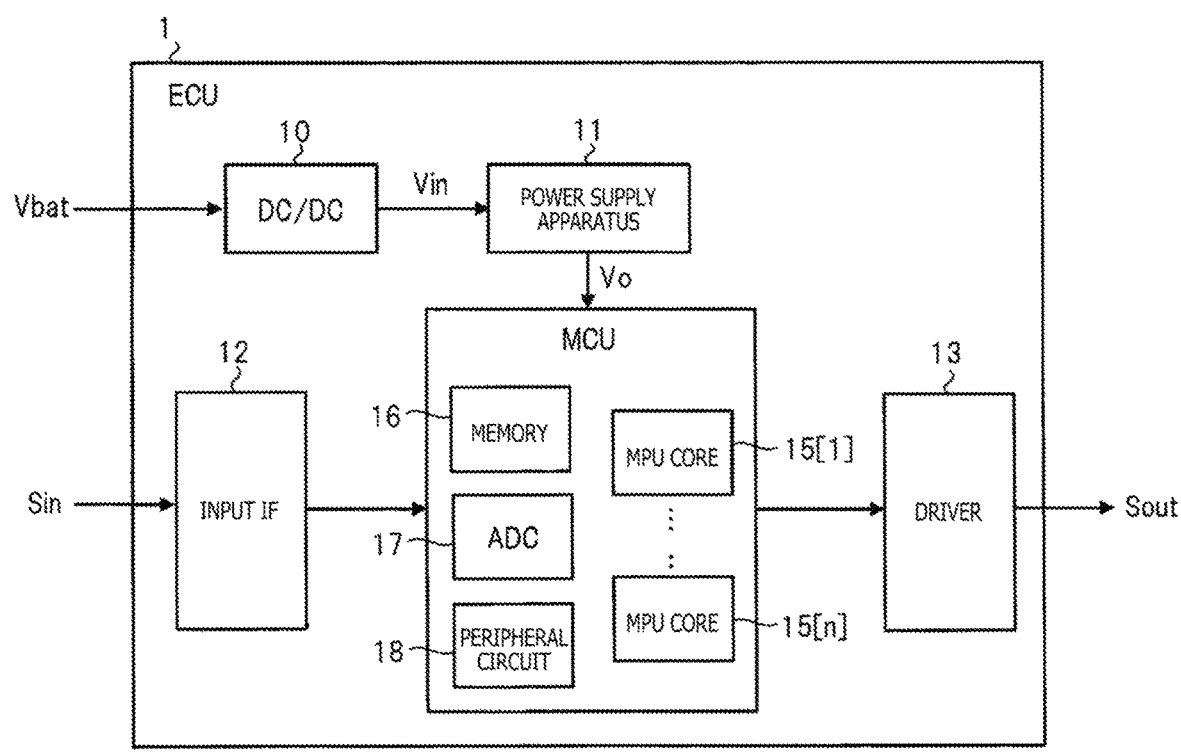
FIG. 1 is a schematic diagram illustrating a configuration example of main parts of an electronic control unit according to a first embodiment of the present invention.

FIG. 1 is a schematic diagram illustrating a configuration example of main parts of an electronic control unit according to a first embodiment of the present invention. An electronic control unit 1 illustrated in FIG. 1 is a vehicle-mounted ECU, for example. The electronic control unit 1 includes a DC/DC converter 10, a power supply apparatus 11, an input interface 12, a microcontroller (mi-con) MCU, and a driver 13, and has a configuration in which these are implemented on a wiring board. The DC/DC converter 10 converts a battery voltage Vbat (e.g., 12V etc.) into a power supply voltage Vin (e.g., 5V etc.). Upon receiving the input voltage (power supply voltage) Vin which is based on the battery power supply Vbat, the power supply apparatus 11 generates a predetermined output voltage (power supply voltage) Vo. The output voltage Vo is 1 V or the like, for example.

The mi-con MCU operates by using, as a power supply, the output voltage Vo of the power supply apparatus 11. For example, the mi-con MCU includes a plurality of MPU cores 15[1] to 15[n], a memory 16, an analog-digital converter (ADC) 17, and various types of peripheral circuits 18. The mi-con MCU receives various types of sensor signals Sin from the outside of the unit via the input interface 12, generates various types of control signals Sout which correspond to the various types of sensor signals Sin by using program processing and the like, and transmits the various types of control signals Sout to the outside of the unit via the driver 13. Various types of actuators or the like that operate upon receiving the various types of control signals Sout are provided outside the unit. For example, the various types of sensor signals Sin indicate detection results about the operation states of the various types of actuators or the like.

In recent years, while the functions of vehicles become higher, there is a demand for reduction in the number of ECUs mounted on the vehicles, or the like. Because of this, there is a tendency for the number of control targets of a single electronic control unit 1 to increase, and also there is a tendency for its current consumption to increase. In order to suppress such an increase in current consumption, the mi-con MCU in some cases has the function of activating only necessary circuit blocks (e.g., some MPU cores) in periods when they are necessary, and sets unnecessary circuit blocks to a sleep mode. In this case, the sudden change rate of load current as seen from the power supply apparatus 11 (current consumption of the mi-con MCU) increases. On the other hand, in order for the mi-con MCU to operate normally, it is necessary to keep variations (i.e., ripples) of the output voltage Vo within a required range. Because of this, the power supply apparatus 11 is demanded to have an enhanced response speed to sudden load changes (and consequently to reduce ripples).

Configuration and Operation of Power Supply Apparatus (Comparative Example)

Figure 12:
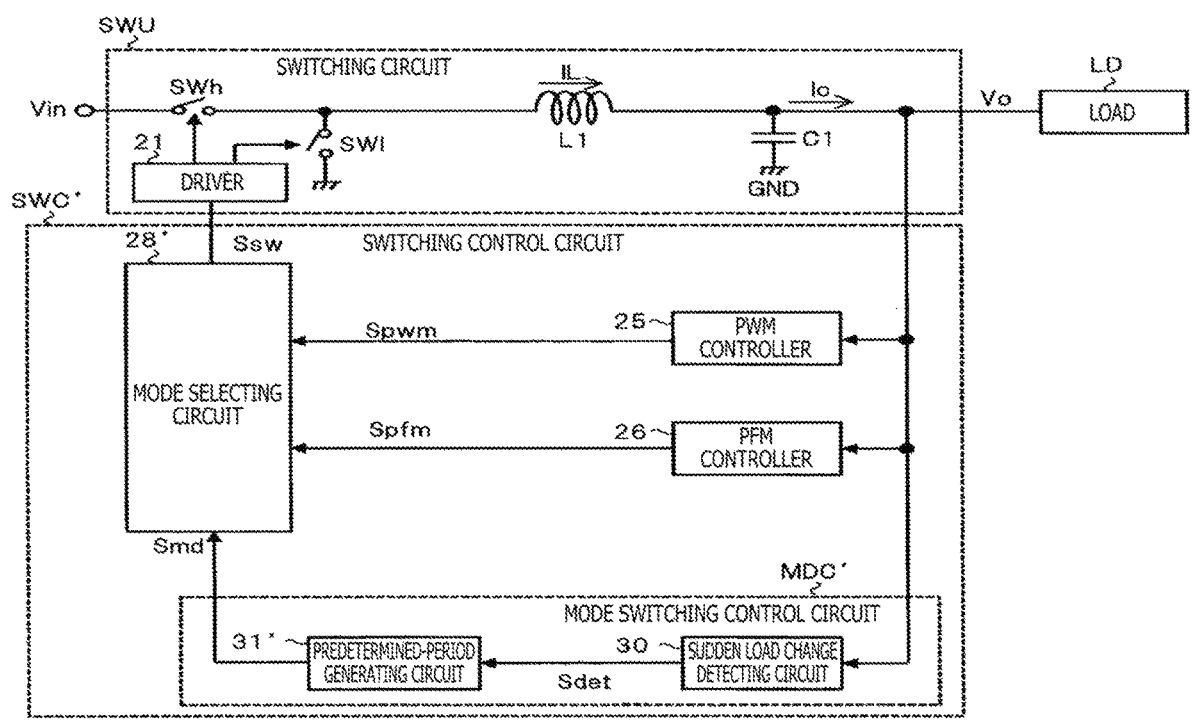
FIG. 12 is a schematic diagram illustrating a configuration example of main parts of a power supply apparatus considered as a comparative example of the present invention.

FIG. 12 is a schematic diagram illustrating a configuration example of main parts of a power supply apparatus considered as a comparative example of the present invention. The power supply apparatus illustrated in FIG. 12 includes a switching circuit SWU, and a switching control circuit SWC', and supplies a generated output voltage Vo to an external load LD (e.g., the mi-con MCU illustrated in FIG. 1). The switching control circuit SWC' generates a switching control signal Ssw for keeping the output voltage Vo constant by using the output voltage Vo as a feedback input.

The switching circuit SWU includes a driver 21, a high side switching element SWh and a low side switching element SWl, an inductor L1, and a smoothing output capacitor C1. The switching element SWh is coupled between an input voltage Vin and an output node, and the switching element SWl is coupled between the output node and a ground power supply voltage GND. Upon receiving the switching control signal Ssw, the driver 21 controls the high side switching element SWh, and the low side switching element SWl such that they are turned on and turned off complementarily. Thereby, the switching elements SWh and SWl control the output voltage Vo.

Specifically, in a high-level period of the switching control signal Ssw, the switching element SWh is turned on, and the switching element SWl is turned off. In this period, electrical power from the input voltage Vin is accumulated in the inductor L1, and also is supplied to the load LD. On the other hand, in a low-level period of the switching control signal Ssw, the switching element SWh is turned off, and the switching element SWl is turned on. In this period, the electrical power accumulated in the inductor L1 is supplied to the load LD. The output voltage Vo is controlled according to the ratio (i.e., duty ratio) of the high-level period in one cycle of the switching control signal Ssw (the total of the high-level period and low-level period). The smoothing output capacitor C1 serves the function of suppressing ripples of the output voltage Vo.

The switching control circuit SWC' includes a PWM controller 25, a PFM controller 26, a mode selecting circuit 28', and a mode switching control circuit MDC'. The PWM controller 25 uses a PWM control mode to generate a PWM signal (switching signal) Spwm having a constant frequency and a changing pulse width, according to the feedback input from the output voltage Vo. Various circuit systems for the PWM controller 25 are known, and the PWM controller 25 may use any of the circuit systems, although an illustration thereof is omitted. Representative examples include: a system in which the duty ratio of a PWM signal is set by directly generating a triangular wave (or a sawtooth wave) and comparing the triangular wave (sawtooth wave) with an error signal that is based on the output voltage Vo; a system in which a triangular wave is generated by utilizing an inductor current IL flowing through the inductor L1; and the like.

The PFM controller 26 uses a PFM control mode to generate a PFM signal (switching signal) Spfm having a changing frequency, according to the feedback input from the output voltage Vo. Similarly, various circuit systems for the PFM controller 26 are known, and the PFM controller 26 may use any of the circuit systems, although an illustration thereof is omitted. Representative examples include: a system in which two threshold voltages are set, and high-level/low-level periods of the PFM signal Spfm is set such that the output voltage Vo stays within the range of the two threshold voltages; a system in which one threshold voltage is set, and high pulses with a fixed pulse width are output when the output voltage Vo reached the threshold voltage; and the like.

The mode switching control circuit MDC' asserts the mode switching signal Smd when the output voltage Vo deviated from a predetermined voltage range, and negates the mode switching signal Smd after a lapse of a predetermined period after the output voltage Vo recovers. The mode switching control circuit MDC' specifically includes a sudden load change detecting circuit 30, and a predetermined-period generating circuit 31'.

For example, the sudden load change detecting circuit 30 includes two comparator circuits that detect whether or not the output voltage Vo deviated from a predetermined voltage range. One of the comparator circuits uses a threshold voltage (sudden load increase threshold voltage) having a lower voltage level than the output voltage Vo to assert a sudden load change detection signal Sdet in a period during which the output voltage Vo falls below the threshold voltage. In other words, assertion of the sudden load change detection signal Sdet means detection of a sudden load increase. The other one of the comparator circuits uses a threshold voltage (sudden load decrease threshold voltage) having a higher voltage level than the output voltage Vo to assert the sudden load change detection signal Sdet in a period during which the output voltage Vo exceeds the threshold voltage. In other words, assertion of the sudden load change detection signal Sdet means detection of a sudden load decrease.

The predetermined-period generating circuit 31' asserts the mode switching signal Smd in response to the assertion of the sudden load change detection signal Sdet, and negates the mode switching signal Smd after waiting for a predetermined period to pass after the sudden load change detection signal Sdet being asserted became negated. The predetermined period is a period that is necessary for the output voltage Vo to recover to a target value, and to become stabilized.

According to the mode switching signal Smd, the mode selecting circuit 28' selects and outputs one of the PWM signal Spwm and the PFM signal Spfm as the switching control signal Ssw. Specifically, the mode selecting circuit 28' selects the PWM signal Spwm in the mode switching signal negation period (i.e., at the steady state of the load LD), and selects the PFM signal Spfm in the mode switching signal Smd assertion period (i.e., at the time of a sudden change of the load LD).

Here, since the switching frequency is fixed in the PWM control mode, the switching frequency needs to be set high in order to enhance the response speed at the time of a sudden load change. However, in this case, the switching loss of the power supply apparatus increases (i.e., the power consumption increases), so it is not easy to set the switching frequency high actually. On the other hand, since the frequency varies due to a load current Io in the PFM control mode, the response speed at the time of a sudden load change can be increased while at the same time the switching loss is suppressed to a certain degree. However, since EMI (Electro Magnetic Interference) standards are strict for vehicle-mounted power supply apparatuses, it is not easy to apply only the PFM control mode. In view of this, it is beneficial to adopt a mode switching system as illustrated in FIG. 12 in which the PWM control mode is used at the steady state of a load, and the PFM control mode is used at the time of a sudden load change.

Operation of Power Supply Apparatus
(Comparative Example)

Figure 13:
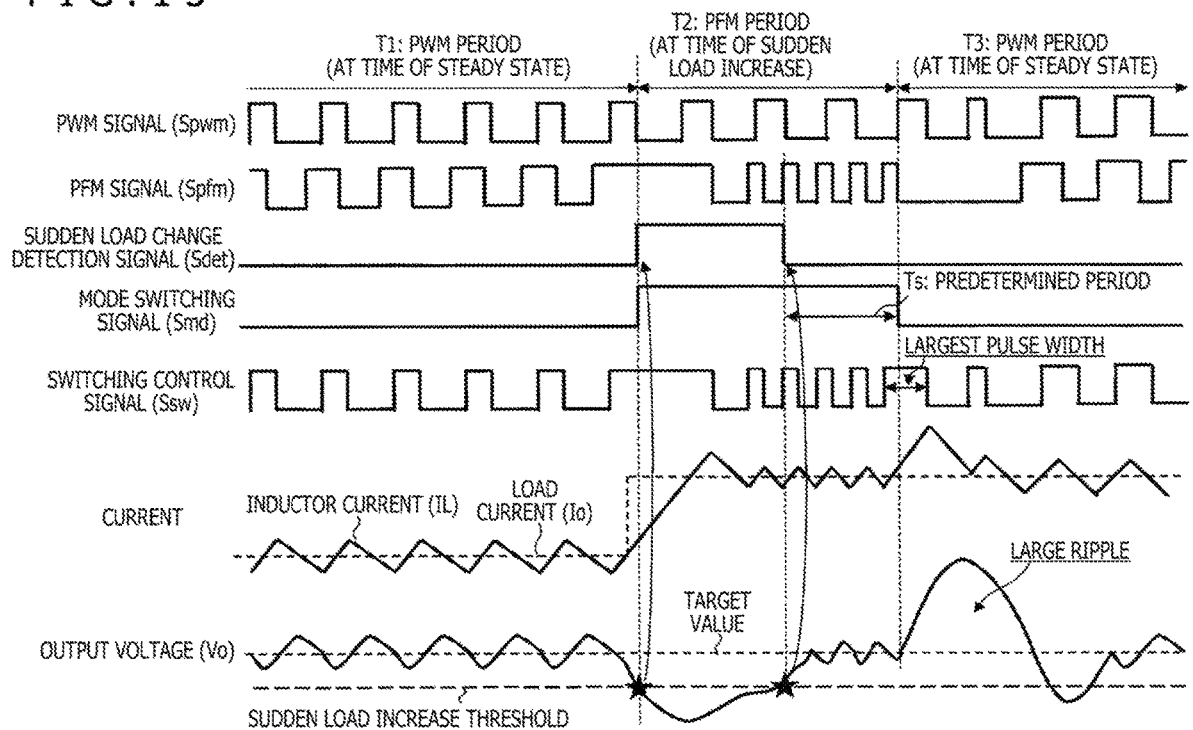
FIG. 13 is a timing chart illustrating an example of operation performed at the time of a sudden load change in the power supply apparatus illustrated in FIG. 12.

FIG. 13 is a timing chart illustrating an example of operation performed at the time of a sudden load change in the power supply apparatus illustrated in FIG. 12. In a period T1 which corresponds to the steady state of the load current Io, the level of the mode switching signal Smd from the mode switching control circuit MDC' becomes the negation level (here, the low level), and the mode selecting circuit 28' selects the PWM signal Spwm as the switching control signal Ssw, and outputs the PWM signal Spwm to the switching circuit SWU. The switching elements SWh and SWl of the switching circuit SWU are controlled such that they are turned on and turned off by the switching control signal Ssw (i.e., the PWM signal Spwm), and generate the output voltage Vo from the input voltage Vin.

Thereafter, in a period T2 which corresponds to the time of a sudden increase in the load current Io, the output voltage Vo lowers along with the sudden load increase, and the sudden load change detecting circuit 30 switches the level of the sudden load change detection signal Sdet to the assertion level (here, the high level) when the output voltage Vo falls below the sudden load increase threshold voltage. Accordingly, the predetermined-period generating circuit 31' switches the level of the mode switching signal Smd to the assertion level (here, the high level). In response to the assertion of the mode switching signal Smd, the mode selecting circuit 28' selects the PFM signal Spfm as the switching control signal Ssw, and outputs the PFM signal Spfm to the switching circuit SWU.

The switching elements SWh and SWl of the switching circuit SWU are controlled such they are turned on and turned off by the switching control signal Ssw (i.e., the PFM signal Spfm), and stabilize the output voltage Vo. As a result, the output voltage Vo recovers by its lowered amount. When the output voltage Vo exceeds the sudden load increase threshold, the sudden load change detecting circuit 30 switches the level of the sudden load change detection signal Sdet to the negation level (here, the low level). The predetermined-period generating circuit 31' extends the assertion period of the sudden load change detection signal Sdet by a predetermined period Ts. This allows the output voltage Vo to recover to the voltage level in a steady load state (i.e., the target value), and to be in a stabilized state.

The level of the mode switching signal Smd is switched to the negation level after a lapse of the predetermined period Ts generated by the predetermined-period generating circuit 31'. As a result, in a period T3, the mode selecting circuit 28' selects the PWM signal Spwm as the switching control signal Ssw, and outputs the PWM signal Spwm to the switching circuit SWU. The switching elements SWh and SWl of the switching circuit SWU are controlled by the PWM signal Spwm, and generates the output voltage Vo from the input voltage Vin.

Problems of Power Supply Apparatus (Comparative Example)

However, in the power supply apparatus illustrated in FIG. 12, there is a fear that a large ripple might occur in the output voltage Vo at the time of switching from the period T2 (PFM control mode) to the period T3 (PWM control mode) as illustrated in FIG. 13. Specifically, a worst condition can occur in which the switching timing, a falling edge of the PFM signal Spfm, and a rising edge of the PWM signal Spwm accidentally coincide with each other. Since the largest high pulse which is the total of the high pulse width of the PFM signal Spfm, and the high pulse width of the PWM signal Spwm occurs in the worst condition, a large ripple occurs in the output voltage Vo.

For example, as in Patent Document 1, although such a worst condition does not occur in a system in which the frequency of one PWM signal is switched, the worst condition may occur in a system like the one illustrated in FIG. 12 and FIG. 13 in which switching is performed between two signals (the PWM signal Spwm and PFM signal Spfm) having phases that are controlled independently, depending on the relationship between the phases. Note that the timing at which the worst condition may occur is not limited to the one in the case illustrated in FIG. 13, but the worst condition may occur also when the switching timing, a rising edge of the PFM signal Spfm, and a falling edge of the PWM signal Spwm accidentally coincide with each other. In this case, the largest low pulse occurs. In addition, although a case where a sudden load increase occurs is mentioned here as an example, there is a fear that a similar problem might occur also in a case where a sudden load decrease occurs.

Configuration of Power Supply Apparatus (First Embodiment)

Figure 2:
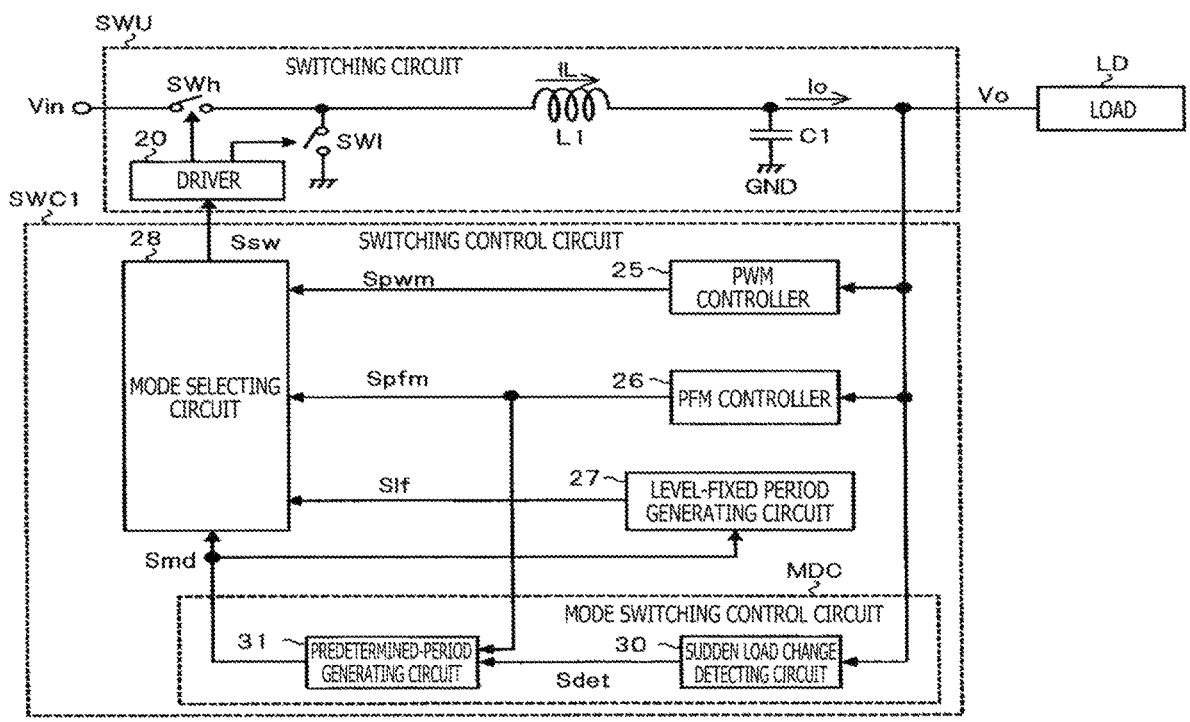
FIG. 2 is a schematic diagram illustrating a configuration example of main parts of a power supply apparatus according to the first embodiment of the present invention.

FIG. 2 is a schematic diagram illustrating a configuration example of main parts of a power supply apparatus according to the first embodiment of the present invention. The power supply apparatus illustrated in FIG. 2 includes a switching circuit SWU, and a switching control circuit SWC1, and supplies a generated output voltage Vo to an external load LD (e.g., the mi-con MCU illustrated in FIG. 1). The configuration of the switching circuit SWU is similar to the one illustrated in FIG. 12.

The switching control circuit SWC1 includes a PWM controller 25, a PFM controller 26, a mode selecting circuit 28, a mode switching control circuit MDC, and a level-fixed period generating circuit 27. The PWM controller 25, PFM controller 26, and sudden load change detecting circuit 30 have configurations that are similar to those illustrated in FIG. 12, and the mode selecting circuit 28, and mode switching control circuit MDC have configurations that are slightly different from those illustrated in FIG. 12. The level-fixed period generating circuit 27 is newly provided to the configuration illustrated in FIG. 12.

Similar to the case illustrated in FIG. 12, the mode switching control circuit MDC asserts the mode switching signal Smd when the output voltage Vo deviated from a predetermined voltage range, and negates the mode switching signal Smd after a lapse of a predetermined period after the output voltage Vo recovers. However, unlike the case illustrated in FIG. 12, the mode switching control circuit MDC negates the mode switching signal Smd at a selection timing after a lapse of a predetermined period. The selection timing is set to an edge of the PFM signal Spfm.

The mode switching control circuit MDC specifically includes a sudden load change detecting circuit 30, and a predetermined-period generating circuit 31. The sudden load change detecting circuit 30 has a configuration which is similar to the one illustrated in FIG. 12. Unlike the case illustrated in FIG. 12, upon reception of an input of the PFM signal Spfm, the predetermined-period generating circuit 31 sets a timing of negating the mode switching signal Smd (selection timing) to an edge of the PFM signal Spfm.

The level-fixed period generating circuit (phase adjustment period setting circuit) 27 sets a level-fixed period (phase adjustment period) having a start timing at the selection timing mentioned above. Specifically, the level-fixed period generating circuit 27 generates a level-fixing signal Slf which is at one of a high level and a low level in the level-fixed period, and is at the other one of the high level and the low level in the period excluding the level-fixed period.

Similar to the case illustrated in FIG. 12, the mode selecting circuit 28 selects the PFM signal Spfm as the switching control signal Ssw in the assertion period of the mode switching signal Smd, and selects the PWM signal Spwm in the negation period of the mode switching signal Smd. At this time, based on the mode switching signal Smd, the mode selecting circuit 28 selects the PWM signal Spwm at the selection timing mentioned above instead of the PFM signal Spfm. Then, unlike the case illustrated in FIG. 12, based on the level-fixing signal Slf, the mode selecting circuit 28 forcibly controls the logic level of the switching control signal Ssw (i.e., equivalent to the PWM signal Spwm) in the level-fixed period starting at the selection timing such that the logic level becomes a fixed logic level.

Operation of Power Supply Apparatus (First Embodiment)

Figure 3:
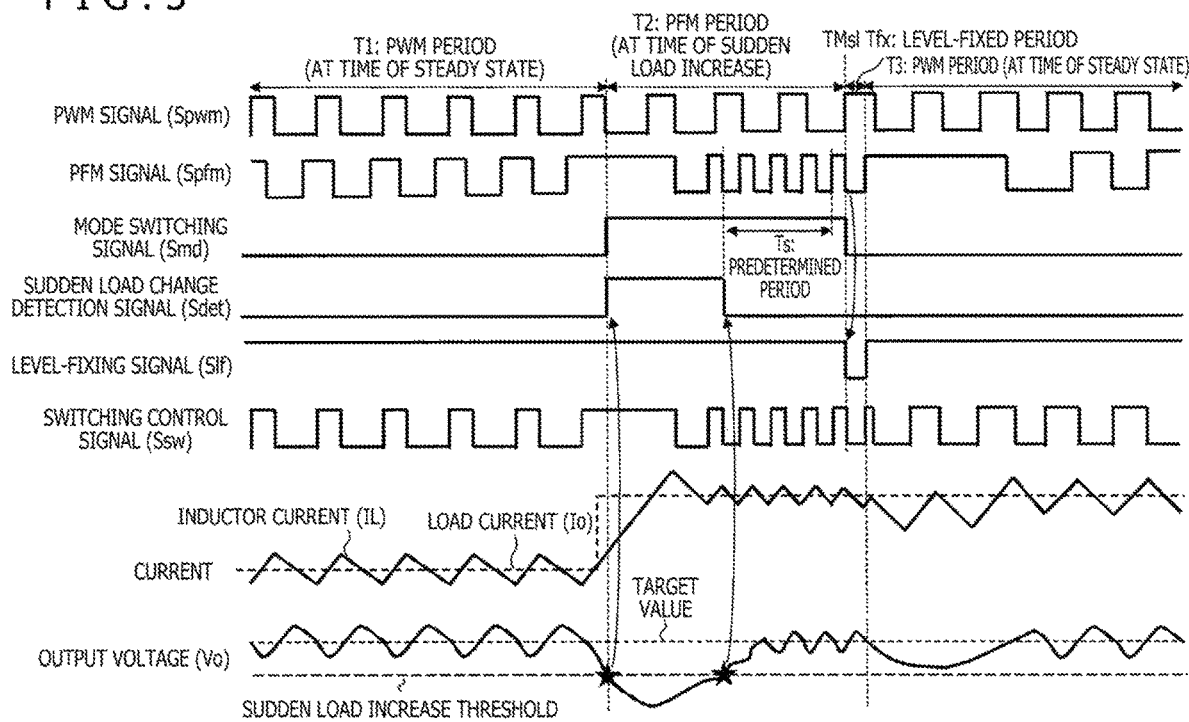
FIG. 3 is a timing chart illustrating an example of operation performed at the time of a sudden load change in the power supply apparatus illustrated in FIG. 2.

FIG. 3 is a timing chart illustrating an example of operation performed at the time of a sudden load change in the power supply apparatus illustrated in FIG. 2. In FIG. 3, the operation in a period T1 corresponding to the steady state of the load current Io is similar to the one illustrated in FIG. 13. In a period T2 which corresponds to the time of a sudden increase in the load current Io, the output voltage Vo lowers along with the sudden load increase, and the sudden load change detecting circuit 30 switches the level of the sudden load change detection signal Sdet to the assertion level (here, the high level) when the output voltage Vo falls below the sudden load increase threshold voltage. Accordingly, the predetermined-period generating circuit 31 switches the level of the mode switching signal Smd to the assertion level (here, the high level). In response to the assertion of the mode switching signal Smd, the mode selecting circuit 28 selects the PFM signal Spfm as the switching control signal Ssw, and outputs the PFM signal Spfm to the switching circuit SWU.

The switching elements SWh and SWl of the switching circuit SWU are controlled such that they are turned on and turned off by the switching control signal Ssw (i.e., the PFM signal Spfm), and stabilize the output voltage Vo. As a result, the output voltage Vo recovers by its lowered amount. When the output voltage Vo exceeds the sudden load increase threshold, the sudden load change detecting circuit 30 switches the level of the sudden load change detection signal Sdet to the negation level (here, the low level). The predetermined-period generating circuit 31 extends the assertion period of the sudden load change detection signal Sdet by a predetermined period Ts. This allows the output voltage Vo to recover to a voltage level in a steady load state (i.e., the target value), and to be in a stabilized state. After a lapse of the predetermined period Ts, the predetermined-period generating circuit 31 switches the level of the mode switching signal Smd to the negation level (here, the low level) at the selection timing TMsl which is set to an edge of the PFM signal Spfm (a falling edge in this example).

In response to the negation of the mode switching signal Smd, the mode selecting circuit 28 selects the PWM signal Spwm as the switching control signal Ssw, and outputs the PWM signal Spwm to the switching circuit SWU. On the other hand, in response to the negation of the mode switching signal Smd, the level-fixed period generating circuit 27 generates a level-fixing signal (a low pulse signal in this example) Slf having a pulse width which is equal to the level-fixed period (phase adjustment period) Tfx having a start timing at the selection timing TMsl. The mode selecting circuit 28 forcibly controls the logic level of the selected switching control signal Ssw (i.e., the PWM signal Spwm) in this level-fixed period Tfx such that the logic level becomes a fixed level (a low level in this example). After a lapse of the level-fixed period Tfx, the switching control signal Ssw becomes equal to the PWM signal Spwm, and similar to the case illustrated in FIG. 13, the steady state operation in the PWM control mode is performed.

Note that the minimum value of the predetermined period Ts generated by the predetermined-period generating circuit 31 is determined according to a length of time required for the output voltage Vo to recover from the sudden load increase threshold to the voltage level (target value) in a steady load state, on the premise that the sudden load change is the largest possible change. This minimum value of the predetermined period Ts is calculated through simulation or the like, for example. The maximum value of the predetermined period Ts is determined according to the frequency of sudden load changes, and it is necessary for the predetermined period Ts to end before a next sudden load change occurs, so the maximum value is determined according to the minimum interval at which sudden load changes may occur. This minimum interval at which sudden load changes may occur may be set based on specifications of a mi-con. For example, if a mi-con operates at 1 MHz (1-μs cycle), the maximum value of the predetermined period Ts is 1 μs.

Details of Level-Fixed Period

Figure 4:
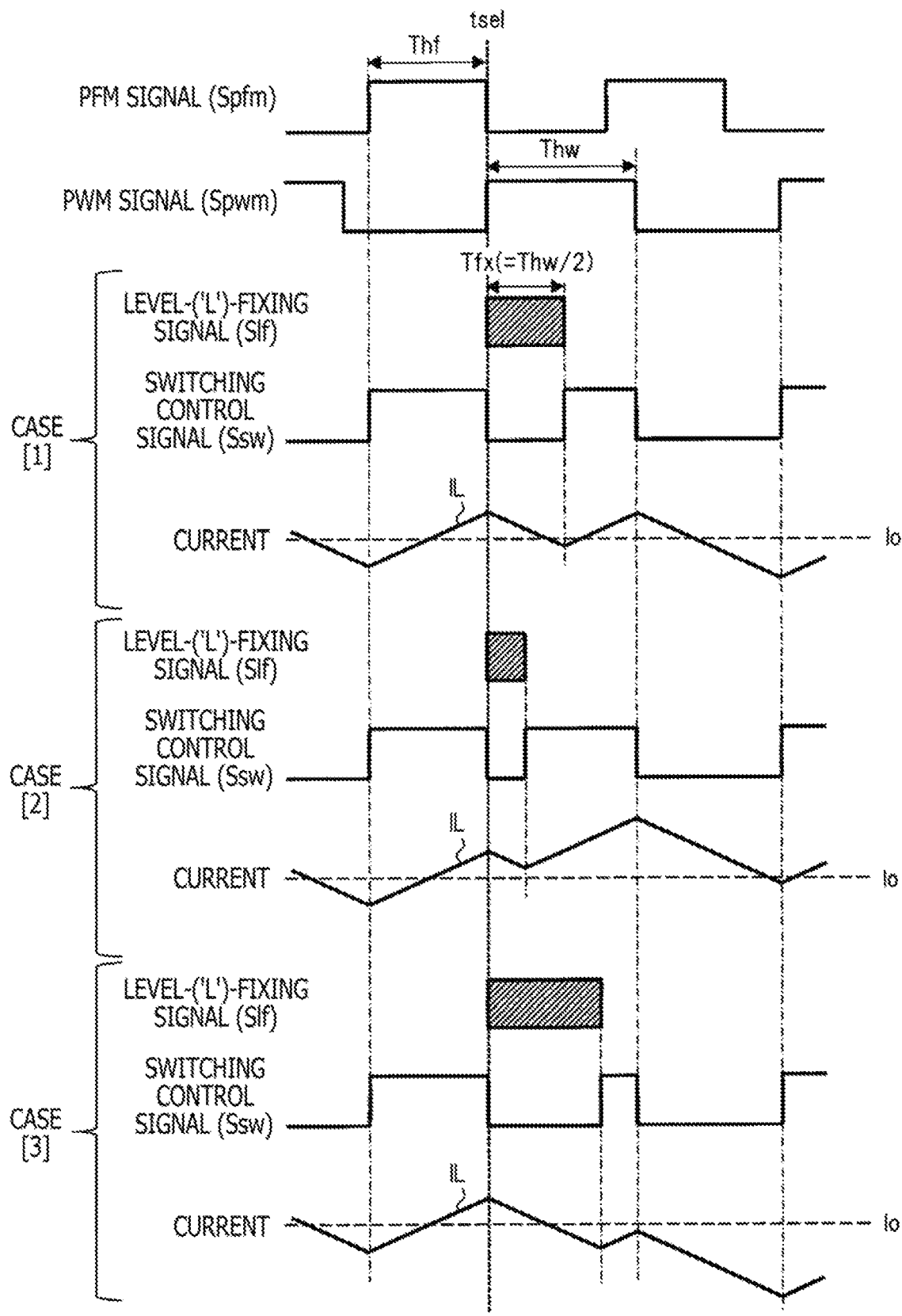
FIG. 4 is a timing chart for explaining the function of a level-fixed period illustrated in FIG. 3.
Figure 5:
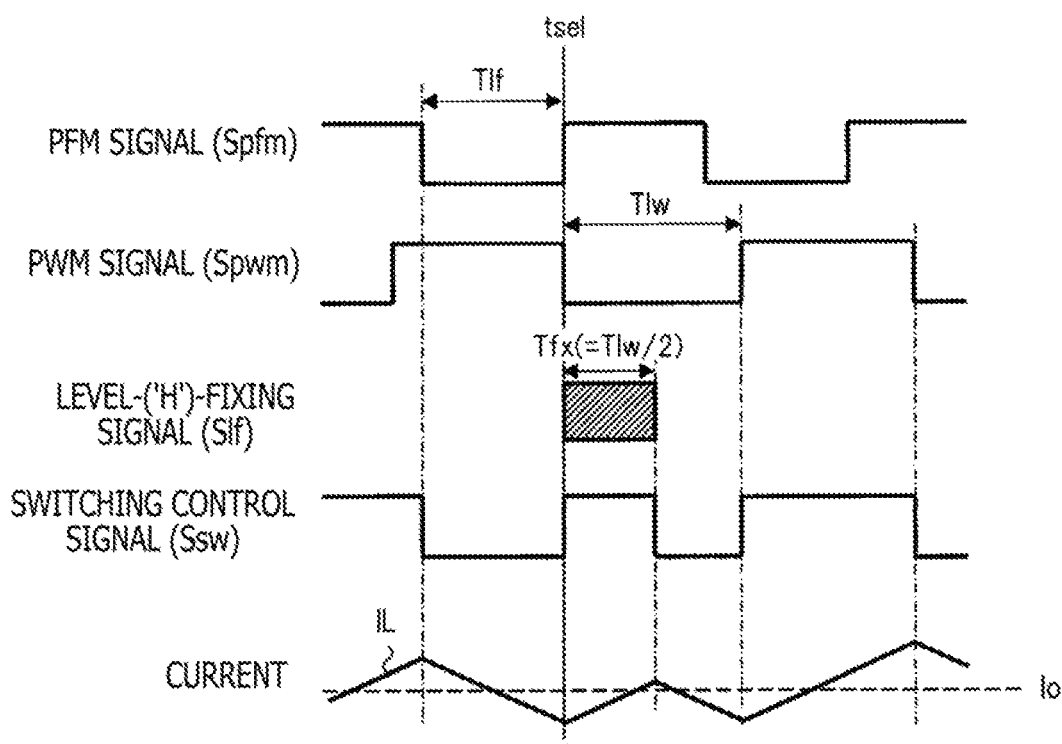
FIG. 5 is a timing chart for explaining the function of the level-fixed period illustrated in FIG. 3.

FIG. 4 and FIG. 5 are timing charts for explaining the function of a level-fixed period illustrated in FIG. 3. FIG. 4 illustrates a worst condition as mentioned with reference to FIG. 13 in which the selection timing TMsl, a falling edge of the PFM signal Spfm, and a rising edge of the PWM signal Spwm coincide with each other, and the largest high pulse occurs. In this case, the worst condition may be eased by forcibly controlling the switching control signal Ssw in the level-fixed period Tfx by using the level-fixing signal Slf, such that the level of the switching control signal Ssw becomes a low level. As a result, an increase in the inductor current IL accompanying a high pulse can be suppressed, and it becomes possible to reduce ripples of the output voltage Vo.

In terms of this easing of the worst condition, the length of the level-fixed period Tfx only needs to be shorter than the pulse width Thf of a logic level (here, a high level) of the PFM signal Spfm immediately before the selection timing TMsl, the logic level being different from a fixed logic level. Alternatively, the length of the level-fixed period Tfx only needs to be shorter than the pulse width Thw of a logic level (a high level) of the PWM signal Spwm immediately after the selection timing TMsl, the logic level being different from a fixed logic level.

However, desirably the length of the level-fixed period Tfx may be approximately a half (e.g., in the range of ⅓ to ⅔, etc.) of the high pulse width Thw of the PWM signal Spwm. This is because if the length of the level-fixed period Tfx is excessively short as illustrated in a case [2], an increase in the inductor current IL cannot be suppressed sufficiently, and the ripple reduction effect lowers. In addition, if the length of the level-fixed period Tfx is excessively long as illustrated in a case [3], the inductor current IL decreases excessively, and a large ripple of the opposite polarity to the one that occurs in the case [2] may occur in the output voltage Vo. In view of this, if the length of the level-fixed period Tfx is set to approximately a half of the high pulse width Thw, as illustrated in a case [1], an increase in the inductor current IL can be suppressed moderately, and it becomes possible to enhance the ripple reduction effect.

FIG. 5 illustrates a worst condition in which the largest low pulse occurs when the selection timing TMsl, a rising edge of the PFM signal Spfm, and a falling edge of the PWM signal Spwm coincide with each other, unlike the case illustrated in FIG. 4. In this case, the worst condition is eased by forcibly controlling the switching control signal Ssw in the level-fixed period Tfx by using the level-fixing signal Slf, such that the level of the switching control signal Ssw becomes a high level. As a result, a decrease of the inductor current IL accompanying a low pulse can be suppressed, and it becomes possible to reduce ripples of the output voltage Vo. In this case also, similar to the case illustrated in FIG. 4, the length of the level-fixed period Tfx may be approximately a half of the low pulse width Tlw of the PWM signal Spwm.

In this manner, if the selection timing TMsl is preset to a falling edge of the PFM signal Spfm by the predetermined-period generating circuit 31, the fixed logic level accompanying the level-fixed period Tfx becomes a low level as illustrated in FIG. 4. On the other hand, if the selection timing TMsl is preset to a rising edge of the PFM signal Spfm by the predetermined-period generating circuit 31, the fixed logic level accompanying the level-fixed period Tfx becomes a high level as illustrated in FIG. 5.

Figure 6A:
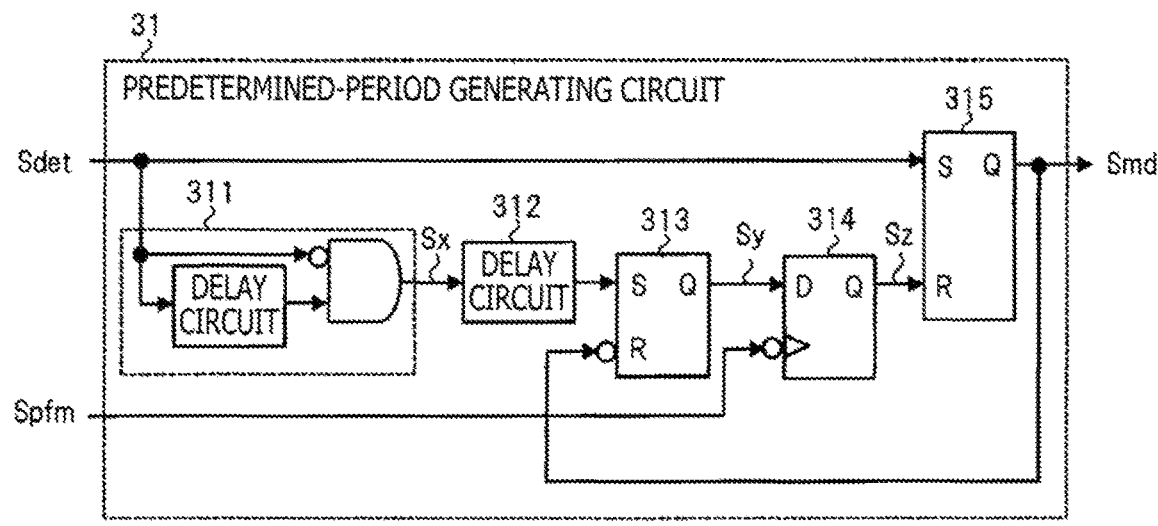
FIG. 6A shows a circuit diagram illustrating a configuration example of a predetermined-period generating circuit illustrated in FIG. 2.
Figure 6B:
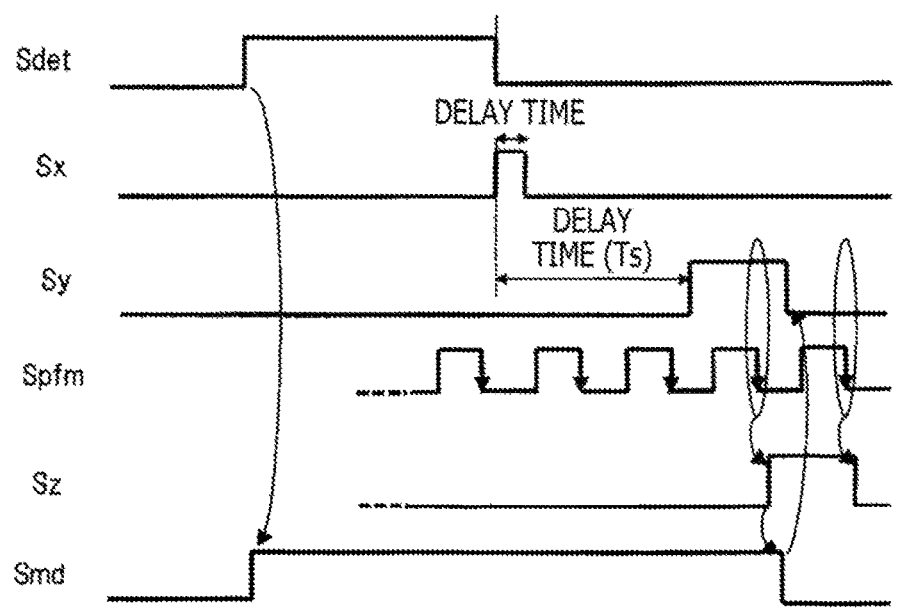
FIG. 6B shows a timing chart illustrating an operation example related to FIG. 6A.

Details of Main Circuits (a) in FIG. 6 is a circuit diagram illustrating a configuration example of a predetermined-period generating circuit illustrated in FIG. 2, and (b) in FIG. 6 is a timing chart illustrating an operation example related to (a) in FIG. 6. The predetermined-period generating circuit 31 illustrated in (a) in FIG. 6 includes a falling edge detecting circuit 311, a delay circuit 312, SR latch circuits 313 and 315, and a D flip-flop circuit 314. When a falling edge of the sudden load change detection signal Sdet occurs, the falling edge detecting circuit 311 outputs a high pulse signal Sx with a pulse width set by an internal delay circuit.

The delay circuit 312 is constituted by multiple stages of inverter circuits or the like, for example, and delays the high pulse signal Sx from the falling edge detecting circuit 311 by predetermined time Ts. The predetermined time Ts is preset through simulation or the like as mentioned with reference to FIG. 3. The SR latch circuit 313 drives the output signal Sy to a set level (high level) according to the high pulse signal from the delay circuit 312.

The D flip-flop circuit 314 latches the output signal Sy of the SR latch circuit 313 at a falling edge of the PFM signal Spfm. As a result, the D flip-flop circuit 314 outputs a high-level output signal Sz at the first falling edge of the PFM signal Spfm after the output signal Sy became a high level (in other words, after a lapse of the predetermined period Ts).

The SR latch circuit 315 drives the mode switching signal Smd to a set level (high level) in response to assertion of the sudden load change detection signal Sdet, and drives the mode switching signal Smd to a reset level (low level) in response to the high-level output signal Sz from the D flip-flop circuit 314. In addition, the SR latch circuit 313 drives the output signal Sy to a reset level (low level) in response to the reset level (low level) of the mode switching signal Smd. Thereafter, the D flip-flop circuit 314 sets the level of the output signal Sz back to a low level in response to a falling edge of the PFM signal Spfm.

Note that the predetermined-period generating circuit 31 is not limited to such a circuit of course, and can be realized with various circuits. In addition, as illustrated in FIG. 3, here, the sudden load change detecting circuit 30 illustrated in FIG. 2 negates the sudden load change detection signal Sdet when the output voltage Vo recovered to a value which is equal to the sudden load increase threshold, but may negate the sudden load change detection signal Sdet when the output voltage Vo recovered to a target value. In this case, the predetermined-period generating circuit 31 generates waiting time for stabilizing the output voltage Vo having recovered to the target value.

Figure 7:
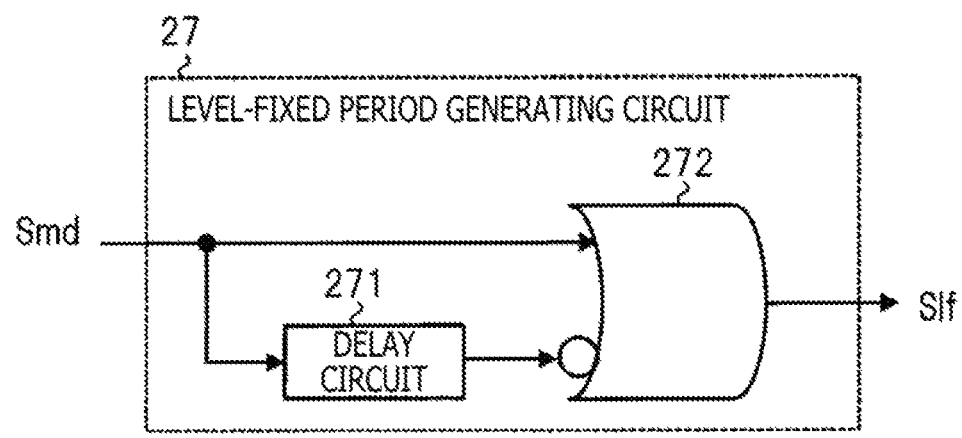
FIG. 7 is a circuit diagram illustrating a configuration example of a level-fixed period generating circuit illustrated in FIG. 2.

FIG. 7 is a circuit diagram illustrating a configuration example of the level-fixed period generating circuit illustrated in FIG. 2. The level-fixed period generating circuit 27 illustrated in FIG. 7 includes a delay circuit 271, and a logic gate 272. The delay circuit 271 is constituted by multiple stages of inverter circuits or the like for example, and delays the mode switching signal Smd by the level-fixed period Tfx. The logic gate 272 outputs, as the level-fixing signal Slf, a result of an OR operation of the mode switching signal Smd and an inverted output signal of the delay circuit 271.

Here, the delay time (i.e., the level-fixed period Tfx) of the delay circuit 271 can be preset fixedly in advance. In other words, for example, as illustrated in FIG. 1, if the input voltage Vin of the power supply apparatus 11 is not the battery voltage Vbat, but an output voltage of the DC/DC converter 10, the value of the input voltage Vin becomes approximately constant. The power supply apparatus 11 generates a constant output voltage Vo from the constant input voltage Vin. Because of this, the duty ratio at the steady state can be predicted highly precisely in advance, and for example the high pulse width Thw of the PWM signal Spwm illustrated in FIG. 4 can also be predicted highly precisely.

Figure 8:
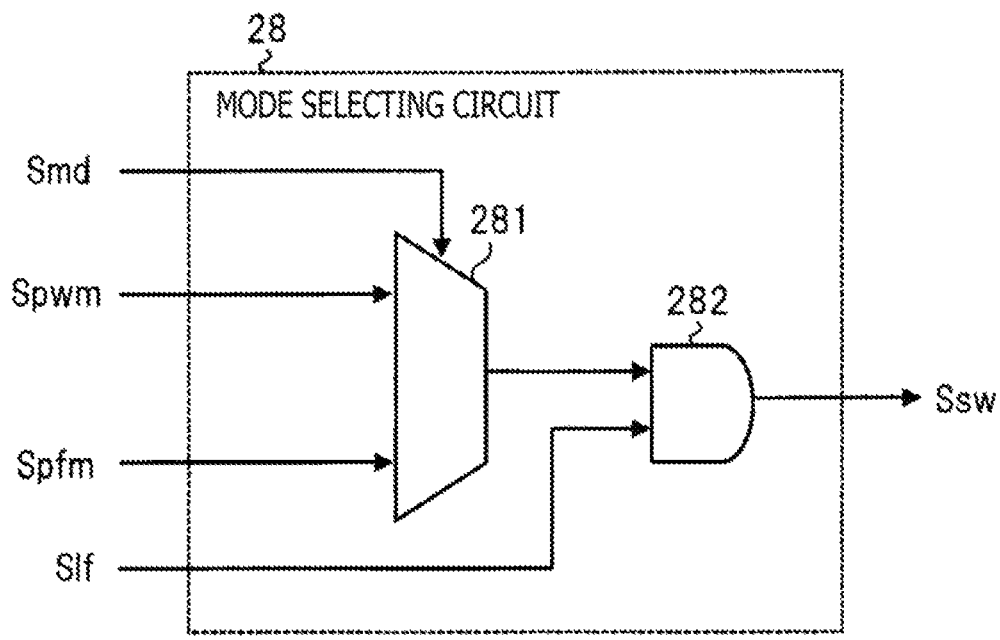
FIG. 8 is a circuit diagram illustrating a configuration example of a mode selecting circuit illustrated in FIG. 2.

FIG. 8 is a circuit diagram illustrating a configuration example of the mode selecting circuit illustrated in FIG. 2. The mode selecting circuit 28 illustrated in FIG. 8 includes a selecting circuit 281, and a logic gate 282. The selecting circuit 281 selects the PWM signal Spwm if the mode switching signal Smd is at the negation level (low level), and selects the PFM signal Spfm if the mode switching signal Smd is at the assertion level (high level). The logic gate 282 outputs, as the switching control signal Ssw, a result of an AND operation of output of the selecting circuit 281, and the level-fixing signal Slf.

Note that in the examples illustrated in (a) in FIG. 6, FIG. 7, and FIG. 8, the selection timing TMsl is set to a falling edge of the PFM signal Spfm, but similar principles also apply if it is set to a rising edge. In this case, for example, the D flip-flop circuit 314 illustrated in (a) in FIG. 6 may be modified to have a configuration of a rising edge trigger, the polarity of the level-fixing signal Slf illustrated in FIG. 7 may be reversed, and the logic gate 282 illustrated in FIG. 8 may be replaced with an OR gate.

Main Effects of First Embodiment

As mentioned above, by using the power supply apparatus and electronic control unit according to the first embodiment, the worst condition due to switching between two signals having phases that are controlled independently can be eased, and it becomes possible to realize reduction in ripples. As a result, for example, in a vehicle-mounted electronic control unit, an attempt can be made for an increase in control targets, and the like. Note that the example explained here is about the case of a sudden load increase, but similar principles apply also to the case of a sudden load decrease.

SECOND EMBODIMENT

Premise Problems

In the first embodiment mentioned above, the level-fixed period Tfx is set to a fixed value as explained with reference to FIG. 7. However, for example, in FIG. 1, in a case where the battery voltage Vbat is directly input to the power supply apparatus 11, a case where the use environment of the power supply apparatus 11 largely varies, or a case where there are variations in characteristics of individual circuits, there is a fear that the high pulse width Thw of the PWM signal Spwm in FIG. 4 cannot be predicted highly precisely. If the ratio between the high pulse width Thw and the level-fixed period Tfx cannot be maintained appropriately, the ripple reduction effect lowers as illustrated in FIG. 4.

Configuration and Operation of Power Supply Apparatus (Second Embodiment)

Figure 9:
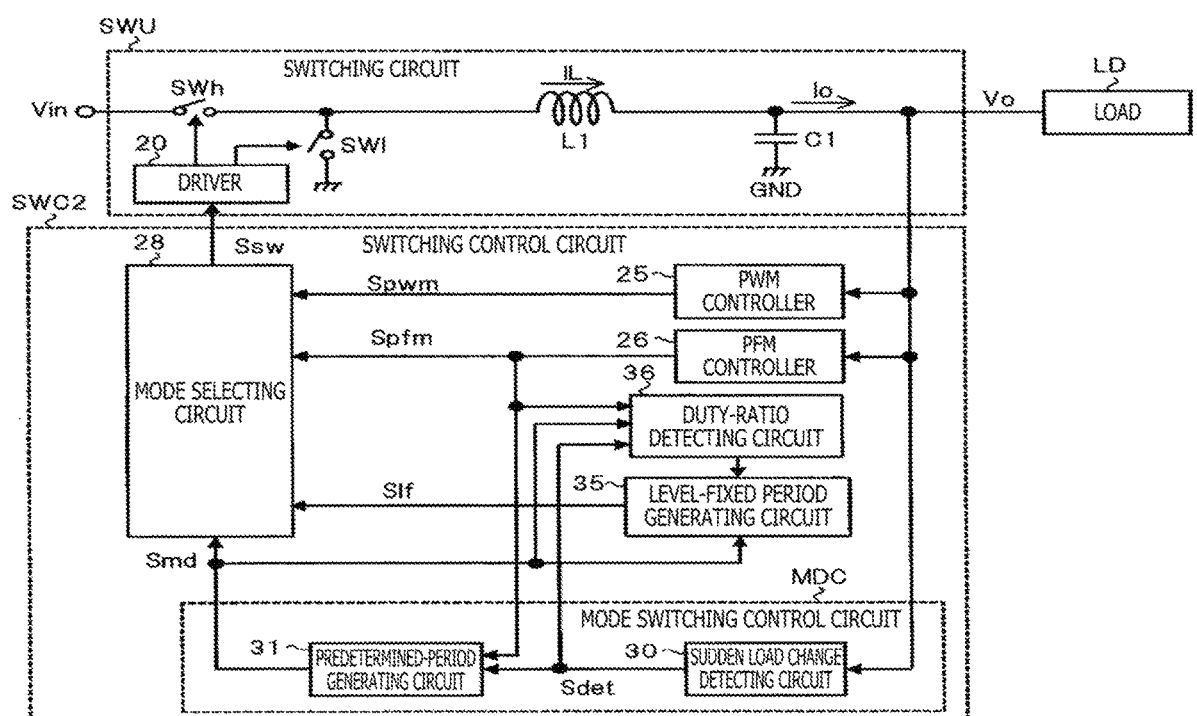
FIG. 9 is a schematic diagram illustrating a configuration example of main parts of a power supply apparatus according to a second embodiment of the present invention.

FIG. 9 is a schematic diagram illustrating a configuration example of main parts of a power supply apparatus according to a second embodiment of the present invention. The power supply apparatus illustrated in FIG. 9 includes a switching control circuit SWC2 with a different configuration as compared with the power supply apparatus illustrated in FIG. 2. The switching control circuit SWC2 is slightly different in terms of the configuration of the level-fixed period generating circuit 35 as compared with the switching control circuit SWC1 illustrated in FIG. 2, and further includes a duty-ratio detecting circuit 36 additionally.

The duty-ratio detecting circuit 36 detects the duty ratio of the PFM signal Spfm or PWM signal Spwm in the predetermined period Ts of the mode switching control circuit MDC illustrated in FIG. 3, and variably controls the length of the level-fixed period (phase adjustment period) Tfx in a manner reflecting the duty ratio. At this time, desirably, the duty-ratio detecting circuit 36 recognizes the length of the period of a logic level (a high level in FIG. 3) of the PWM signal Spwm different from a logic level in the level-fixed period Tfx on the basis of a result of detection of the duty ratio. Then, the duty-ratio detecting circuit 36 controls the level-fixed period Tfx such that the recognized length and the length of the level-fixed period Tfx maintain a predetermined ratio (e.g., 2:1 as in the case [1] illustrated in FIG. 4). In this case, for example, if in FIG. 3 the high pulse period of the PFM signal Spfm in the predetermined period Ts (and consequently the high pulse period of the PWM signal Spwm) becomes longer, the level-fixed period Tfx of a low level also becomes longer.

In the example illustrated in FIG. 9, the duty-ratio detecting circuit 36 recognizes the predetermined period Ts based on the mode switching signal Smd, and sudden load change detection signal Sdet, and detects the duty ratio of the PFM signal Spfm in the predetermined period Ts. Since the duty ratio of the PFM signal Spfm is stable in the predetermined period Ts, the duty-ratio detecting circuit 36 detects the duty ratio of the PFM signal Spfm by using the duty ratio of a predetermined PFM cycle that is preset, the average value of the duty ratios of individual PFM cycles or the like. Then, the duty-ratio detecting circuit 36 recognizes the length of a high-level period in the PWM signal Spwm by making the detected duty ratio reflected in the length of one cycle of the PWM signal Spwm set in advance.

The level-fixed period generating circuit 35 has a configuration in which the delay circuit 271 illustrated in FIG. 7 is replaced with a variable delay circuit, for example. The delay time of the variable delay circuit is variably controlled by the duty-ratio detecting circuit 36. Note that here, in the circuit system of the duty-ratio detecting circuit 36 illustrated in FIG. 9, the duty ratio of the PFM signal Spfm is detected, and the duty ratio is converted into the length of a high-level period in the PWM signal Spwm, but of course the duty ratio of the PWM signal Spwm may be directly detected. However, since in terms of the response speed to a sudden load change, the duty ratio of the PWM signal Spwm in the predetermined period Ts might be unstable, the duty ratio of the PFM signal Spfm is detected in the system used in this example.

Main Effects of Second Embodiment

By using the power supply apparatus and electronic control unit according to the second embodiment mentioned thus far, it is possible in some cases to make an attempt to further reduce ripples in addition to that similar effects to those in the first embodiment can be attained. In other words, even in a case in which there are various types of cause for variations, the length of the level-fixed period Tfx can be appropriately maintained accordingly, and the ripple reduction effect can be enhanced.

THIRD EMBODIMENT

Premise Problems

In the first and second embodiments, the duty ratio of the PWM signal Spwm does not converge to a proper value in some cases immediately after switching from the PFM signal Spfm to the PWM signal Spwm depending on the response speed of the PWM control mode. In other words, there is a fear that a significant difference is generated between the duty ratio of the PFM signal Spfm immediately before the switching, and the duty ratio of the PWM signal Spwm immediately after the switching. In this case, ripples can occur due to an improper duty ratio of the PWM signal Spwm.

Configuration of Power Supply Apparatus (Third Embodiment)

Figure 10:
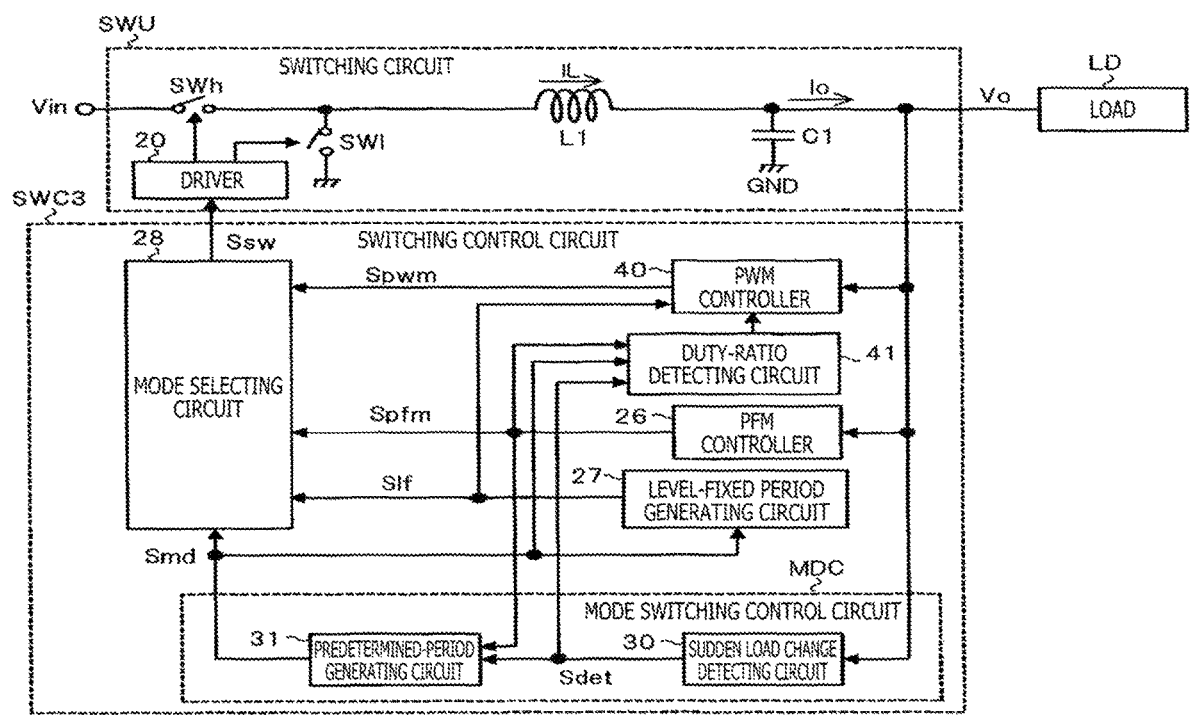
FIG. 10 is a schematic diagram illustrating a configuration example of main parts of a power supply apparatus according to a third embodiment of the present invention.

FIG. 10 is a schematic diagram illustrating a configuration example of main parts of a power supply apparatus according to a third embodiment of the present invention. The power supply apparatus illustrated in FIG. 10 includes a switching control circuit SWC3 with a different configuration as compared with the power supply apparatus illustrated in FIG. 2. The switching control circuit SWC3 is slightly different in terms of the configuration of a PWM controller 40 as compared with the switching control circuit SWC1 illustrated in FIG. 2, and furthermore includes a duty-ratio detecting circuit 41 with a slightly different configuration as compared with that illustrated in FIG. 9.

The PWM controller 40 performs operations of stopping an operation of generating the PWM signal Spwm in a level-fixed period (phase adjustment period) Tfx, and resuming an operation of generating the PWM signal Spwm at a timing at which the level-fixed period Tfx ends. Specifically, for example, in the circuit system of the PWM controller 40 in an assumed case, the PWM signal Spwm is generated based on a result of comparison between an error signal and a triangular wave signal generated at a triangular wave generating circuit. In this case, the triangular wave generating circuit stops an operation of generating the triangular wave signal in the level-fixed period Tfx, and resumes the generation operation at a timing at which the level-fixed period Tfx ends.

In addition, in the circuit system of the PWM controller 40 in an assumed case, the SR latch circuit is regularly set using a clock signal from a clock generating circuit, and the PWM signal Spwm is generated by resetting the SR latch circuit at a timing which is based on an error signal. In this case, the clock generating circuit stops an operation of generating the clock signal in the level-fixed period Tfx, and resumes the generation operation at a timing at which the level-fixed period Tfx ends. The duty-ratio detecting circuit 41 detects the duty ratio of the PFM signal Spfm in a predetermined period of the mode switching control circuit MDC, and makes the duty ratio reflected in the first one cycle of the PWM signal Spwm from the PWM controller 40 having resumed the generation operation.

Operation of Power Supply Apparatus (Third Embodiment)

Figure 11:
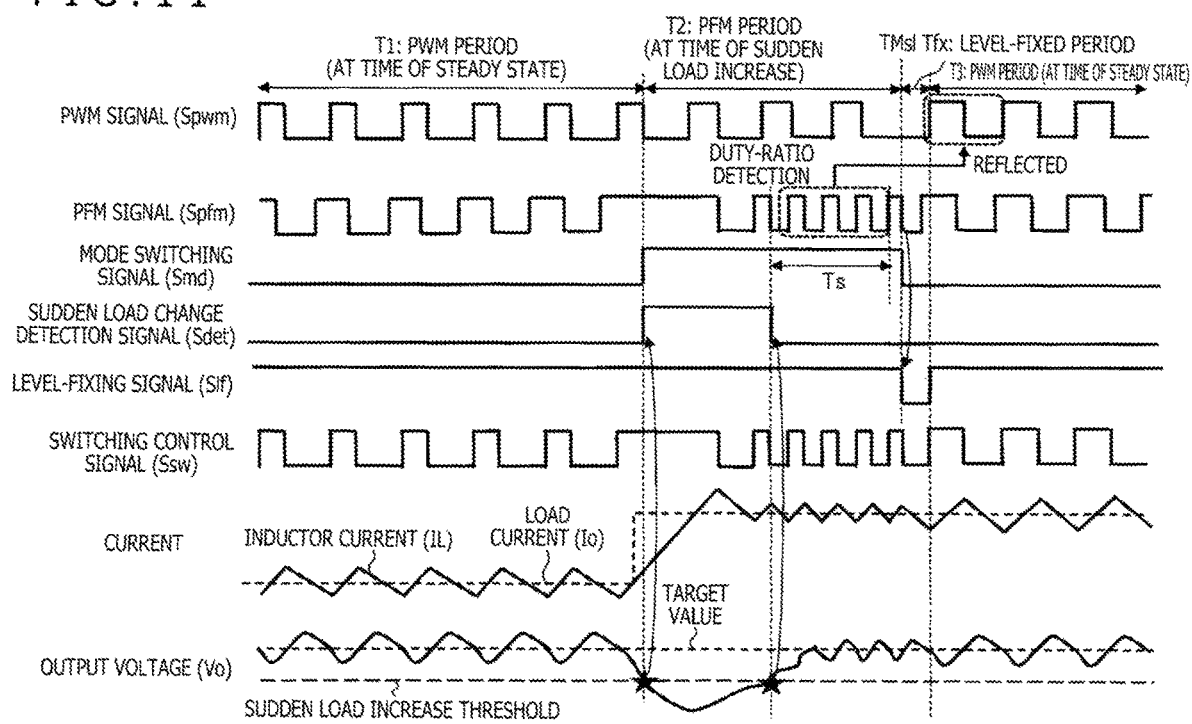
FIG. 11 is a timing chart illustrating an example of operation performed at the time of a sudden load change in the power supply apparatus illustrated in FIG. 10.

FIG. 11 is a timing chart illustrating an example of operation performed at the time of a sudden load change in the power supply apparatus illustrated in FIG. 10. Unlike the case illustrated in FIG. 3, in FIG. 11, the duty-ratio detecting circuit 41 detects the duty ratio of the PFM signal Spfm in the predetermined period Ts within the period T2. In addition, in the level-fixed period Tfx after the selection timing TMsl, the PWM signal Spwm itself is fixed at a low level along with the stop of the operation of generating the PWM signal Spwm, and accordingly the switching control signal Ssw is also fixed at an 'L' level.

Thereafter, after a lapse of the level-fixed period Tfx, the operation of generating the PWM signal Spwm is resumed. The duty ratio of the first one cycle of the PWM signal Spwm following the resumption is set to a value which is the same as the duty ratio of the PFM signal Spfm detected by the duty-ratio detecting circuit 41. As a result, it becomes possible to reduce ripples of the output voltage Vo at the earlier stage of the period T3 as compared with the case illustrated in FIG. 3.

Main Effects of Third Embodiment

By using the power supply apparatus, and electronic control unit according to the third embodiment mentioned thus far, it is possible in some cases to make an attempt to further reduce ripples in addition to that similar effects to those in the first embodiment can be attained. In other words, the duty ratio of the PFM signal Spfm in the predetermined period Ts is a proper value corresponding to the load current Io, and this proper value can be reflected in the duty ratio of the PWM signal Spwm immediately after switching. As a result, it becomes possible to reduce ripples of the output voltage Vo even if a sufficient response speed of the PWM control mode cannot be attained.

The invention made by the present inventors has been explained specifically based on embodiments thus far, but the present invention is not limited to those embodiments, and can be modified variously within a scope not deviating from main parts thereof. For example, the embodiments mentioned above are explained in detail in order to explain the present invention in an easy-to-understand manner, and the present invention is not necessarily limited to those including all the explained configurations. In addition, some of configurations of an embodiment can be replaced with configurations of another embodiment, and it is also possible to add configurations of an embodiment to configurations of another embodiment. In addition, some of configurations of each embodiment can be subjected to addition, removal, and replacement of other configurations.

For example, the power supply apparatus in each embodiment can be widely applied not only to vehicle-mounted ECUs, but to apparatuses that supply power supplies to loads with large sudden load changes.

DESCRIPTION OF REFERENCE CHARACTERS

1: Electronic control unit
11: Power supply apparatus
25: PWM controller
26: PFM controller
27: Level-fixed period generating circuit
28: Mode selecting circuit
36, 41: Duty-ratio detecting circuit
MCU: Microcontroller
MDC: Mode switching control circuit
SWC: Switching control circuit
SWU: Switching circuit
SWh, SWl: Switching element
Slf: Level-fixing signal
Smd: Mode switching signal
Spfm: PFM signal
Spwm: PWM signal
Ssw: Switching control signal
Tfx: Level-fixed period
Ts: Predetermined period
Vo: Output voltage
TMsl: Selection timing

The invention claimed is:

1. A power supply apparatus comprising:
a first controller that uses a first control mode to generate a first switching signal;
a second controller that uses a second control mode to generate a second switching signal having a phase independent of the first switching signal;
a phase adjustment period setting circuit that sets a phase adjustment period having a start timing at a selection timing set to an edge of the second switching signal;
a mode selecting circuit that selects, at the selection timing and as a switching control signal, the first switching signal instead of the second switching signal, and controls a logic level of the switching control signal in the phase adjustment period starting at the selection timing, such that the logic level becomes a fixed logic level; and
a switching element that is controlled such that the switching element is turned on and turned off based on the switching control signal from the mode selecting circuit, and controls an output voltage.

2. The power supply apparatus according to claim 1, wherein
the first control mode is a fixed-frequency PWM (Pulse Width Modulation) control mode, and
the second control mode is a variable-frequency PFM (Pulse Frequency Modulation) control mode.

3. The power supply apparatus according to claim 1, wherein
the phase adjustment period setting circuit generates a level-fixing signal which is at one of a high level and a low level in the phase adjustment period, and is at another one of the high level and the low level in a period excluding the phase adjustment period.

4. The power supply apparatus according to claim 1, wherein
the fixed logic level is a low level if the selection timing is preset to a falling edge of the second switching signal, and is a high level if the selection timing is preset to a rising edge of the second switching signal.

5. The power supply apparatus according to claim 4, wherein
the phase adjustment period is shorter than a pulse width of a logic level of the second switching signal immediately before the selection timing, the logic level being different from the fixed logic level, or shorter than a pulse width of a logic level of the first switching signal immediately after the selection timing, the logic level being different from the fixed logic level.

6. The power supply apparatus according to claim 4, further comprising:
a mode switching control circuit that asserts a mode switching signal when the output voltage has deviated from a predetermined voltage range, and negates the mode switching signal at the selection timing after a lapse of a predetermined period after the output voltage recovers, wherein
the mode selecting circuit selects the second switching signal in an assertion period of the mode switching signal, and selects the first switching signal in a negation period of the mode switching signal.

7. The power supply apparatus according to claim 6, further comprising:
a duty-ratio detecting circuit that detects a duty ratio of the first switching signal or the second switching signal in the predetermined period of the mode switching control circuit, and that variably controls a length of the phase adjustment period in a manner reflecting the duty ratio.

8. The power supply apparatus according to claim 7, wherein
the duty-ratio detecting circuit recognizes a length of a period of a logic level of the first switching signal, the logic level being different from the fixed logic level, on a basis of a result of the detection of the duty ratio, and controls the phase adjustment period such that the recognized length and the length of the phase adjustment period maintains a predetermined ratio.

9. The power supply apparatus according to claim 6, wherein
the first controller stops an operation of generating the first switching signal in the phase adjustment period, and resumes the operation of generating the first switching signal at a timing when the phase adjustment period ends.

10. The power supply apparatus according to claim 9, the first control mode being a fixed-frequency PWM (Pulse Width Modulation) control mode,
the second control mode being a variable-frequency PFM (Pulse Frequency Modulation) control mode,
the power supply apparatus further comprising: a duty-ratio detecting circuit that detects a duty ratio of the second switching signal in the predetermined period of the mode switching control circuit, and makes the duty ratio reflected in a first one cycle of the first switching signal from the first controller that has resumed the generation operation.

11. An electronic control unit comprising:
a power supply apparatus that generates a predetermined output voltage based on a battery power supply; and
a microcontroller that operates using the output voltage of the power supply apparatus as a power supply, wherein
the power supply apparatus includes:
a first controller that uses a first control mode to generate a first switching signal;
a second controller that uses a second control mode to generate a second switching signal having a phase independent of the first switching signal;
a phase adjustment period setting circuit that sets a phase adjustment period having a start timing at a selection timing set to an edge of the second switching signal;
a mode selecting circuit that selects, at the selection timing and as a switching control signal, the first switching signal instead of the second switching signal, and controls a logic level of the switching control signal in the phase adjustment period starting at the selection timing, such that the logic level becomes a fixed logic level; and
a switching element that is controlled such that the switching element is turned on and turned off based on the switching control signal from the mode selecting circuit, and controls the output voltage.

12. The electronic control unit according to claim 11, wherein
the first control mode is a fixed-frequency PWM (Pulse Width Modulation) control mode, and
the second control mode is a variable-frequency PFM (Pulse Frequency Modulation) control mode.

13. The electronic control unit according to claim 11, wherein
the fixed logic level is a low level if the selection timing is preset to a falling edge of the second switching signal, and is a high level if the selection timing is preset to a rising edge of the second switching signal.

14. The electronic control unit according to claim 13, wherein
the power supply apparatus further includes a mode switching control circuit that asserts a mode switching signal when the output voltage has deviated from a predetermined voltage range, and negates the mode switching signal at the selection timing after a lapse of a predetermined period after the output voltage recovers, and
the mode selecting circuit selects the second switching signal in an assertion period of the mode switching signal, and selects the first switching signal in a negation period of the mode switching signal.

15. The electronic control unit according to claim 14, wherein
the power supply apparatus further includes a duty-ratio detecting circuit that detects a duty ratio of the first switching signal or the second switching signal in the predetermined period of the mode switching control circuit, and variably controls a length of the phase adjustment period in a manner reflecting the duty ratio.

* * * * *